United States Patent
Hsu et al.

(10) Patent No.: US 7,018,928 B2
(45) Date of Patent: Mar. 28, 2006

(54) PLASMA TREATMENT METHOD TO REDUCE SILICON EROSION OVER HDI SILICON REGIONS

(75) Inventors: Li Te Hsu, Tainan (TW); Chia Lun Chen, Tainan (TW); Chiang Jen Peng, Jhubei (TW); Pin Chia Su, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 172 days.

(21) Appl. No.: 10/656,584

(22) Filed: Sep. 4, 2003

(65) Prior Publication Data

US 2005/0054209 A1    Mar. 10, 2005

(51) Int. Cl.
*H01L 21/302* (2006.01)
(52) U.S. Cl. .................. 438/705; 438/708; 438/710; 438/715; 438/725
(58) Field of Classification Search ................. 438/705, 438/708, 710, 715, 725
See application file for complete search history.

(56) References Cited

U.S. PATENT DOCUMENTS

| | | | |
|---|---|---|---|
| 6,379,576 B1 * | 4/2002 | Luo et al. ...................... 216/67 |
| 6,479,396 B1 * | 11/2002 | Xu et al. ...................... 438/723 |
| 6,699,771 B1 * | 3/2004 | Robertson .................... 438/420 |
| 6,762,085 B1 * | 7/2004 | Zheng et al. ................ 438/199 |

* cited by examiner

*Primary Examiner*—Nadine G. Norton
*Assistant Examiner*—Binh X. Tran
(74) *Attorney, Agent, or Firm*—Tung & Assoc.

(57) ABSTRACT

A method for reducing the loss of silicon in a plasma assisted photoresist etching process including providing a silicon substrate including a polysilicon gate structure; masking a portion of the silicon substrate with photoresist to carry out an ion implantation process for forming source and drain regions; carrying out an ion implantation process; and, removing the photoresist according to at least one plasma assisted process wherein the at least one plasma assisted process comprises fluorine containing, oxygen, and hydrogen containing plasma source gases.

20 Claims, 2 Drawing Sheets

PLASMA TREATMENT METHOD TO REDUCE SILICON EROSION OVER HDI SILICON REGIONS

FIELD OF THE INVENTION

This invention generally relates to plasma enhanced etching including reactive ion etching (RIE) of MOSFET devices formed in microelectronic and nanoelectronic integrated circuit manufacturing and more particularly to a plasma treatment method carried out simultaneously and/or sequentially with an RIE or plasma ashing method to repair silicon dangling bonds to avoid silicon loss over doped, e.g., high dose implant (HDI) silicon regions.

BACKGROUND OF THE INVENTION

As devices become smaller and integration density increases, reactive ion etching (RIE) has become a key process in anisotropic etching of semiconductor feature. RIE or ion-enhanced etching works by a combination of physical and chemical mechanisms for achieving selectivity and anisotropicity during the etching process. Generally, plasma assisted etching operates in the milliTorr range and above. Generally, three processes compete with each other during plasma etching; physical bombardment by ions, chemical etching by radicals and ions, and surface passivation by the deposition of passivating films. In some applications, for example, high density plasmas (HDP) having a higher density of ions and operating at lower pressures have been increasing used in etching processes.

One RIE process also referred to as plasma ashing uses an oxygen plasma source gas to accomplish the removal of photoresist or polymeric residues following an etching process. One problem area in plasma ashing relates to the removal of photoresist masks following an ion implantation process, for example to form source and drain regions. Typically a silicon oxide layer is formed over the silicon at the source and drain regions prior to carrying out a high dose implant (HDI). During the HDI, the photoresist is subjected to high energy ions that induce cross-linking reactions to harden an upper shell of the photoresist. Subsequent ashing processes using only oxygen are generally ineffective for removing the hardened photoresist, requiring the use of fluorine containing plasma source gases to remove the hardened photoresist and polymer residues.

One problem with a fluorine/oxygen plasma etching chemistry is that silicon over the doped silicon regions, for example the source/drain regions tends to be removed thereby altering the electrical operation of a MOSFET device. For example drain current saturation at a given applied gate voltage is altered, for example lowered. In addition, parasitic leakage, for example junction leakage due to decreased junction depth is increased detrimentally altering electrical functioning of the device.

Another problem with prior art processes, is that the use of fluorine containing plasmas in photoresist removal processes tends to preferentially etch through the oxide layer which is formed over the source and drain regions to moderate the ion implantation energies and protect the underlying silicon. As a result, plasma etching damage to the underlying silicon frequently results including etch away a portion of the silicon.

There is therefore a need in the semiconductor device processing art to develop an improved method for etching photoresist layers following a silicon doping process to avoid plasma etching damage including loss of doped silicon areas thereby improving device reliability and process wafer yield.

It is therefore an object of the invention to provide an improved method for etching photoresist layers following a silicon doping process to avoid plasma etching damage including loss of doped silicon areas thereby improving device reliability and process wafer yield while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for reducing the loss of silicon in a plasma assisted photoresist etching process.

In a first embodiment, the method includes providing a silicon substrate including a polysilicon gate structure; masking a portion of the silicon substrate with photoresist to carry out an ion implantation process for forming source and drain regions; carrying out an ion implantation process; and, removing the photoresist according to at least one plasma assisted process wherein the at least one plasma assisted process comprises fluorine containing, oxygen, and hydrogen containing plasma source gases.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a particular NMOS and PMOS device, it will be appreciated that the method of the present invention may be applied to the formation of any MOSFET device where loss or erosion of silicon over a doped region including amorphized silicon may advantageously be reduced or avoided in a plasma etching process.

Figure 1A:
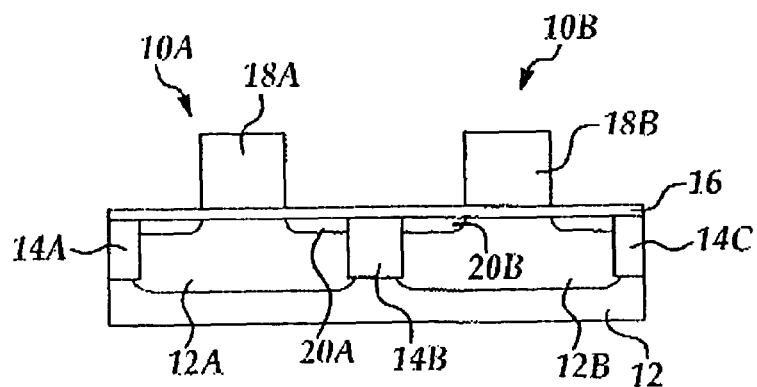
FIGS. 1A–1D are cross sectional schematic representations of an exemplary portion of a CMOS device including NMOS and PMOS portions formed in parallel at stages of manufacture according to an embodiment of the present invention.

Referring to FIGS. 1A–1D in an exemplary embodiment of the method of the present invention, are shown cross-sectional schematic views of a portion of a semiconductor wafer during stages in production of CMOS structures including NMOS and PMOS devices 10A and 10B. For example, referring to FIG. 1A is shown a silicon substrate 12 including p-doped well region 12A and n-doped well region 12B formed by conventional methods, for example a masking process followed by ion implantation and activation annealing to form the respective doped well regions. Formed by conventional processes prior to forming the n-well and p-well regions are isolation areas, for example shallow trench isolation structures, 14A, 14B, 14C back filled with a dielectric, for example TEOS oxide.

Still referring to FIG. 1A, following the well region formation process, the wafer is cleaned by conventional processes to expose the silicon surface and a gate dielectric layer 16 is formed. The gate dielectric is typically formed of thermally grown $SiO_2$, but may also be formed of high-K dielectric materials formed over a thermally grown $SiO_2$ layer, for example by atomic layer CVD.

Still referring to FIG. 1A, a polysilicon layer is then deposited over the gate dielectric layer 16 to a thickness of about 1500 Angstrom to about 3000 Angstrom. The polysilicon layer is then photolithographically patterned and plasma etched according to a reactive ion etch (RIE) process to form polysilicon gale electrodes e.g., NMOS polysilicon gate electrode 18A and PMOS polysilicon gate electrode 18B. Following formation of the polysilicon gate electrodes source drain extension (SDE) regions e.g., 20A and 20B are formed adjacent the polysilicon electrodes to a shallow depth of about 30 to about 100 nm beneath the silicon surface adjacent the polysilicon electrode sidewalls according to a low energy ion implantation or plasma immersion doping process. Conventional masking processes are used to deposit photoresist masks for respective ion implantation or plasma immersion doping of the NMOS and PMOS devices to form the SDE regions and conventional plasma ashing processes are used to remove the photoresist.

Figure 1B:
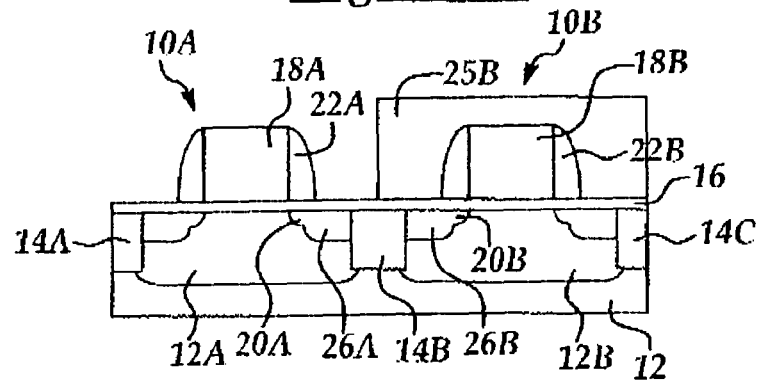

Referring to FIG. 1B, sidewall spacers e.g., 22A and 22B are formed adjacent the polysilicon gate electrode sidewalls by depositing one or more layers of silicon nitride (e.g., $Si_3N_4$), silicon oxynitride (e.g., SiON), or silicon oxide (e.g., $SiO_2$) over the gate dielectric followed by etching away portions of the one or more layers to form self-aligned sidewall spacers on either side of the polysilicon gate electrodes. Typically, either the gate oxide layer 16 remains over the silicon regions adjacent the polysilicon electrodes following the spacer formation process or a new silicon oxide layer is grown or deposited adjacent the polysilicon gate electrodes. The oxide layer e.g., gate oxide layer 16 serves to protect the silicon surface from impurities during a subsequent ion implantation and minimizes ion channeling effects.

Following sidewall spacer formation, a photoresist mask 25B is deposited to cover an area including one of the NMOS or PMOS device gate areas leaving the other device, e.g. the NMOS device 10A gate area uncovered for carrying out a high dose ion implantation (HDI) to form the high density implant source and drain regions in the silicon substrate adjacent the sidewall spacers e.g., 22A. For example dopant atoms are implanted to a dose of about 1 to $5 \times 10^{15}$ dopant atoms/$cm^2$ and at energies up to about 2 MeV to form a doped region e.g., 26A of deeper depth compared to the SDE regions e.g., 20A. The polysilicon electrodes 18A and 18B may optionally be doped at the same time the HDI is carried out to form the source and drain regions to lower a sheet resistance of the polysilicon.

The HDI process, which is carried out at significantly higher implantation energies compared to the SDE ion implantations, causes significant damage to the silicon substrate producing silicon amorphization whereby amorphous silicon regions frequently extend to the surface of the silicon substrate due to accumulation of silicon lattice damage in the ion implantation process. The depth of the amorphous layer will depend on the mass of the ion implanted, for example boron or arsenic, and the energy of the ions implanted during ion implantation.

Figure 1C:
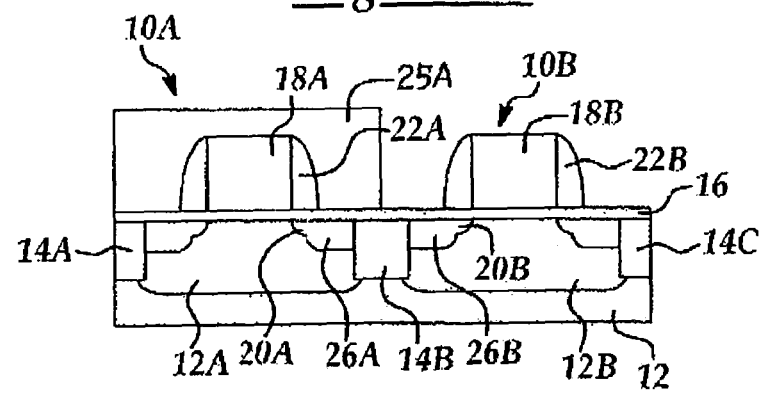
Figure 1D:
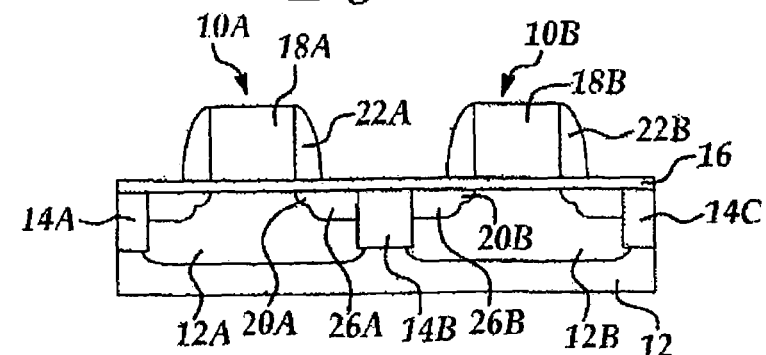

Referring to FIGS. 1C and 1D, following the HDI implantation process of one of the CMOS devices it is necessary to remove the photoresist mask e.g., 25B prior to forming photoresist mask 25A as shown in FIG. 1C and repeating the HDI process to form high density implant source and drain regions e.g., 26B in the PMOS device 10B. During the HDI processes, the high energy of the implantation ions induces cross-linking reactions to form a hardened (cross-linked) shell in the upper portion of the photoresist layer, requiring the use of fluorine and oxygen containing plasmas to effectively etch and remove the photoresist mask e.g., 25B following a first HDI process in addition to removing photoresist mask 25A as shown in FIG. 1D, following a second HDI process to form doped source and drain regions e.g., 26A.

It has been found that use of fluorocarbon/oxygen chemistries in the plasma etching (ashing) process to remove the photoresist undesirably tends to etch through the silicon oxide (e.g., $SiO_2$) layer over the silicon substrate to expose the silicon substrate while removing the photoresist. Subsequently, oxygen in the plasma reacts with dangling Si bonds formed by the ion implant process to form silicon-oxide bonds (e.g., $SiO_2$) which is then preferentially etched by the fluorine in the etching plasma. As a result, portions of the silicon substrate are lost (eroded) by sequential formation of silicon oxide and etching of the formed silicon oxide at the silicon substrate surface. As a result of silicon erosion, the doping profiles and junction depths of the source and drain regions are altered thereby altering electrical functioning of the NMOS or PMOS device, for example, forming parasitic current leakage paths and altering saturation current behavior in response to applied gate Voltage.

According to an aspect of the invention, a photoresist etching (ashing) is carried out whereby hydrogen gas is simultaneously or sequentially included as a source gas in the plasma assisted etching or ashing process to reduce silicon erosion, for example by coordinating dangling (coordinatively unsaturated) silicon bonds with hydrogen to block reaction with oxygen. In one embodiment, the etching chemistry includes at least one of a fluorocarbon and hydrofluorocarbon, preferably $CF_4$, oxygen ($O_2$), and hydrogen ($H_2$), and an inert gas, for example argon helium or nitrogen, or mixtures thereof. The hydrogen is supplied either separately from the inert gas to form a predetermined volumetric ratio, or supplied in a pre-mixed state having a predetermined volumetric ratio. In a preferred embodiment, the inert gas is nitrogen and is supplied pre-mixed or separately from H2 to form a volumetric of $N_2$ to $H_2$ gas mixture, preferably where the volumetric ration of $N_2$ to $H_2$ is from about 1 to 10 to about 10 to 1, for example about 1 to 1. For example, the inert gas, preferably nitrogen, allows the adjustment of the hydrogen concentration depending on the extent of silicon damage and the desired rate of hydrogen reaction with the silicon surface to coordinate dangling Si bonds. In addition, adjusting the hydrogen concentration together with adjusting an RF bias, including using a zero RF bias, can further reduce silicon erosion. For example, it has been found that carrying out the photoresist etching process including hydrogen gas can reduce the loss of silicon by up to about 50 percent compared to using a $CF_4/O_2$ etching chemistry according to the prior art.

While not bound by any particular mechanism, it is believed that hydrogen reacts with dangling Si bonds at the surface of the silicon substrate to effectively neutralize the silicon thereby stopping or slowing the reaction of silicon with oxygen to form silicon oxide which is then readily etched by the fluorine chemistry. By neutralizing the silicon dangling bonds against reaction with oxygen, the rate of etching of silicon is significantly reduced thereby avoiding the loss of silicon.

In a another embodiment, the photoresist etching process is carried out in a sequential etch/plasma treat/etch process, whereby a first etching process is carried out for a first period of time using one of a $CF_4/O_2$ and a $CF_4/O_2/H_2$/inert gas etching chemistry to at least partially expose the silicon substrate followed by an in-situ plasma treatment process with a plasma source gas consisting essentially of an inert gas and $H_2$ forming a predetermined volumetric ratio. The $H_2$ and inert gas are either separately fed to form a pre-determined volumetric ratio of plasma source gas or are pre-mixed at a pre-determined volumetric ratio. The inert gas preferably includes at least one of nitrogen, argon, and helium, most preferably nitrogen, having a volumetric ratio of inert gas to $H_2$ of from about 1 to 10 to about 10 to 1, for example about 1 to 1. Following the plasma treatment process with the inert gas/$H_2$ plasma treatment a subsequent in-situ etching process using one of a $CF_4/O_2$ and $CF_4/O_2/H_2$/inert gas etching chemistry is carried out. The sequence of etch/plasma treat/etch may be sequentially repeated for example, carried out from about 1 to about 3 times to completely remove the photoresist while reducing a loss of silicon. Preferably, but not necessarily, a high density plasma formed by a transformer coupled plasma (TCP) source or inductively coupled plasma (ICP) source, also referred to as a dual source plasma (DSP), is used for the photoresist etching process. Such a plasma source is preferred since the RF bias power is advantageously decoupled from the RF source power to allow an adjustably delivered RF bias power, including zero bias power according to preferred embodiments of the present invention.

In an exemplary embodiment for simultaneous etching and Si dangling bond coordination (repair), plasma etching conditions include a plasma pressure of from about 5 to about 100 milliTorr, an RF source power of about 200 to about 1000 Watts, an RF bias power of about 0 to about 100 Watts, and a flow rate of $CF_4$ from about 20 to about 100 sccm, $O_2$ from about 3500 to about 4500 sccm, and a mixture of $N_2H_2$ according to preferred embodiments from about 100 to about 300 sccm. More preferably, a zero RF bias power is used in the photoresist etch step.

Following the photoresist etching process one or more activation annealing steps or one or more high temperature annealing processes, for example at temperatures from about 600° C. to about 850° C. are carried out to activate the source and drain regions by fully or partially recrystallizing the amorphous silicon portions prior to formation of a salicide over the respective source and drain regions. Preferably the entire silicon substrate is recrystallized, for example following the salicide formation process whereby the impurity atoms are activated by being incorporated into lattice sites. After removal of any remaining silicon oxide over the source and drain regions, salicides are then formed, for example cobalt salicide, over the source and drain regions and optionally including an upper portion of the polysilicon gate electrode.

Figure 2:
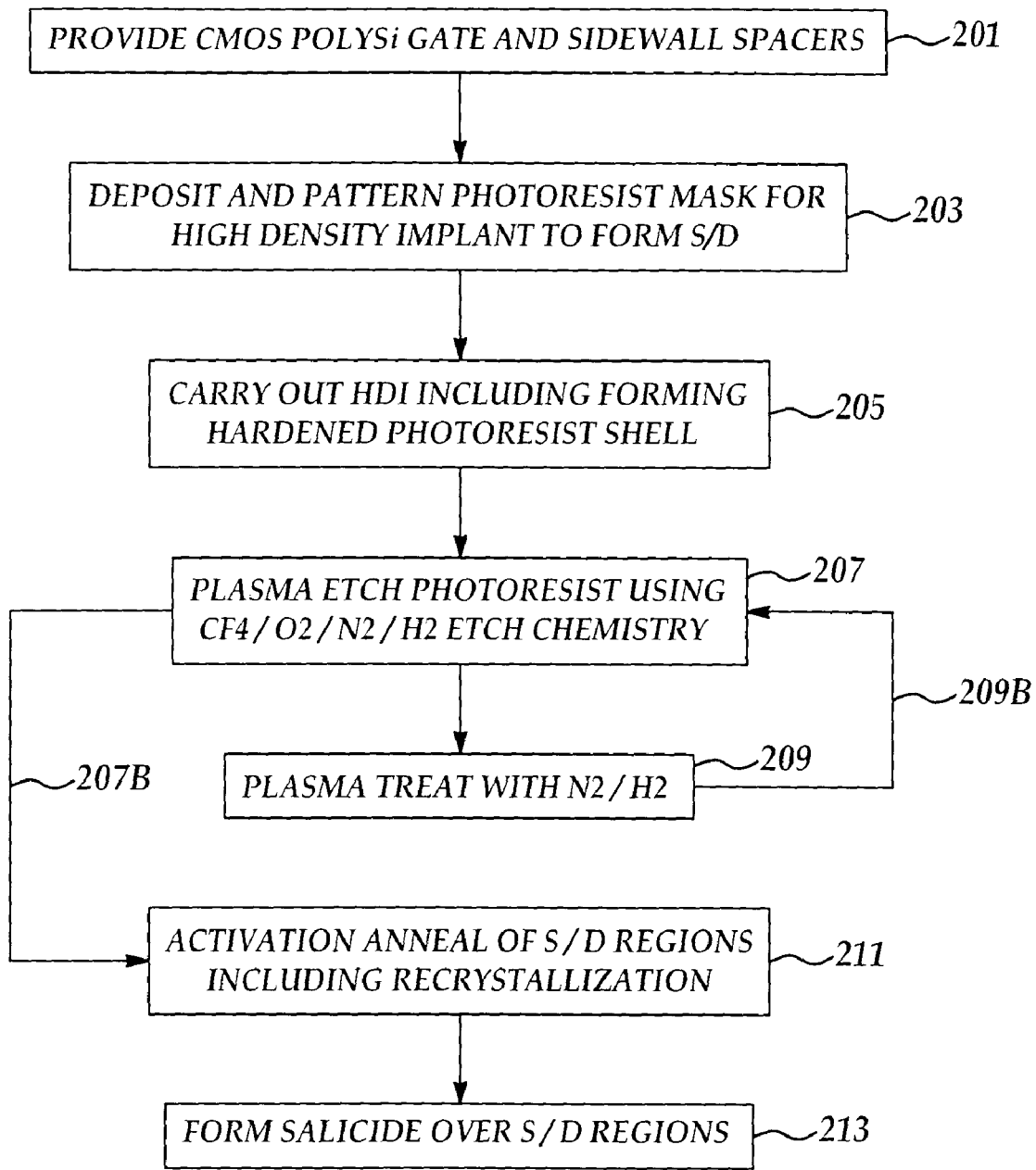
FIG. 2 is an exemplary process flow diagram including several embodiments of the present invention.

Referring to FIG. 2 is a process flow diagram including several embodiments of the present invention. In process 201 a polysilicon CMOS gate structure is provided over a silicon substrate including sidewall spacers with adjacent areas including an exposed protective silicon oxide layer formed over the silicon substrate. In process 203 a photoresist mask is deposited and patterned to cover a portion of the wafer surface to carry out a high density ion implantation (HDI) process to form doped source and drain (S/D) regions. In process 205, the HDI process is carried out forming a hardened shell of photoresist. In process 207, the photoresist mask is removed using a plasma enhanced etching process including a fluorine containing, $O_2$, and $H_2$ containing etching chemistry, for example using a mixture of $CF_4/O_2/N_2/H_2$ plasma source gases. In process 209, an optional plasma treatment is carried out including $H_2$ and an inert gas, for example $N_2/H_2$ as plasma source gases according to preferred embodiments. As indicated by directional process arrow 209B, the etching process in process 207 is repeated and optionally followed by a subsequent plasma treatment process in process 209. As indicated by process directional arrow 207B, upon completion of removal of the photoresist, a subsequent process, e.g., process 211 is carried out. In process 211, at least one activation anneal is carried out to fully or partially recrystallize amorphous silicon portions. In process 213, salicides, for example cobalt salicides are formed over the source and drain regions of the CMOS structure.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing the loss of silicon in a plasma assisted photoresist etching process comprising the steps of:
   providing a silicon-containing substrate including a gate structure;
   masking a portion of the silicon-containing substrate with photoresist, to carry out an ion implantation process for forming source and drain regions;
   carrying out an ion implantation process; and
   removing the photoresist according to at least one plasma assisted process comprising fluorine containing, oxygen, and hydrogen containing plasma source gases to coordinatively saturate at least a portion of coordinatively unsaturated silicon bonds comprising the silicon-containing substrate.

2. The method of claim 1, wherein the at least one plasma assisted etching process is carried out at a zero RF bias.

3. The method of claim 1, wherein a silicon oxide layer is provided over the silicon-containing substrate prior to the ion implantation process.

4. The method of claim 1, wherein an amorphous silicon region is created at the silicon-containing substrate substrate following the ion implantation process.

5. The method of claim 1, wherein the at least one plasma assisted process comprises at least one sequential etch/plasma treatment/etch process wherein the etch process comprises at least one of a fluorocarbon/oxygen and fluorocarbon/oxygen/hydrogen/inert, gas chemistry arid the plasma treatment press comprises a hydroqen/inert gas chemistry.

6. The method of claim 5, wherein the hydrogen/inert gas chemistry consists essentially of a $N_2$ and $H_2$ provided having a volumetric ratio of $N_2$ to $H_2$ of about 10 to 1 to about 1 to 10.

7. The method of claim 1, wherein the at least one plasma assisted process comprises a single plasma etching process.

8. The method of claim 7, wherein the single plasma etching process includes plasma source gases consisting essentially of a fluorocarbon, oxygen, hydrogen, and an inert gas.

9. The method of claim 8, wherein the single plasma etching process includes plasma source gases consisting essentially of a $CF_4$, $O_2$, $H_2$, and $N_2$.

10. The method of claim 9, wherein the $N_2$ and $H_2$ are provided having a volumetric ratio of $N_2$ to $H_2$ of about 10 to 1 to about 1 to 10.

11. A method for reducing the loss of silicon over source and drain regions in a CMOS device in a plasma assisted photoresist etching process comprising the step of:
    providing an exposed silicon oxide layer over a silicon substrate adjacent a polysilicon gate structure comprising adjacent sidewall spacers;
    masking a portion of the exposed silicon oxide layer with photoresist to carry out an ion implantation process over an unexposed region for forming source and drain regions within the silicon substrate;
    carrying out an ion implantation process to form source and drain regions within the silicon substrate including partially amorphizing the source and drain regions to create coordinatively unsaturated silicon bonds comprising the silicon substrate; and,
    removing the photoresist according to a plasma assisted process comprising fluorine containing, oxygen, and hydrogen containing plasma source gases to coordinatively saturate at least a portion of the coordinatively unsaturated silicon bonds.

12. The method of claim 11, wherein the at least one plasma assisted etching process is carried out at a zero RF bias power.

13. The method of claim 11, further comprising carrying out at least one annealing process to at least partially recrystallize the source and drain regions.

14. The method of claim 11, wherein the plasma assisted etching process further comprises in-situ periodic plasma treatment comprising second plasma source gases consisting essentially of an inert gas and $H_2$ gas.

15. The method of claim 14, wherein the second plasma source gases consist essentially of a $N_2$ and $H_2$ provided having a volumetric ratio of $N_2$ to $H_2$ of about 10 to 1 to about 1 to 10.

16. The method of claim 11, wherein the plasma source gases consist essentially of at least one fluorocarbon, oxygen, hydrogen, and an inert gas.

17. The method of claim 16, wherein the plasma source gases consist essentially of the $CF_4$, $O_2$, $H_2$, and $N_2$.

18. The method of claim 17, wherein $N_2$ and $H_2$ are provided having a volumetric ratio of $N_2$ to $H_2$ of about 10 to 1 to about 1 to 10.

19. The method of claim 18, wherein the plasma assisted process operating conditions comprise a $CF_4$ flow rate of about 30 sccm to about 100 sccm, an $O_2$ flow rate of from about 3000 sccm to about 5000 sccm, and a combined flow rate of $N_2$ and $H_2$ of from about 100 sccm to about 300 sccm.

20. A method for reducing the loss of silicon in a plasma assisted photoresist etching process comprising the steps of:
    providing a silicon-containing substrate including a gate structure;
    masking a portion of the silicon-containing substrate with photoresist to carry out an ion implantation process for forming source and drain regions;
    carrying out an ion implantation process; and,
    removing the photoresist according to at least one plasma assisted process comprising fluorine containing, oxygen, and hydrogen containing plasma source gases wherein the at least one plasma assisted process comprises at least one sequential etch/plasma treatment/etch process;
    wherein the etch process comprises at least one of a fluorocarbon/oxygen and fluorocarbon/oxygen/hydrogen/inert gas chemistry and the plasma treatment process comprises a hydrogen/inert gas chemistry.

* * * * *